United States Patent [19]

Haraguchi

[11] Patent Number: 5,381,371
[45] Date of Patent: Jan. 10, 1995

[54] SEMICONDUCTOR MEMORY DEVICE INCORPORATING REDUNDANCY MEMORY CELLS CAPABLE OF ACCESSING DEFECTIVE MEMORY CELLS

[75] Inventor: Yoshinori Haraguchi, Tokyo, Japan

[73] Assignee: NEC Corporation, Tokyo, Japan

[21] Appl. No.: 116,673

[22] Filed: Sep. 7, 1993

[30] Foreign Application Priority Data

Sep. 4, 1992 [JP] Japan .................................. 4-236726

[51] Int. Cl.⁶ ............................................. G11C 29/00
[52] U.S. Cl. ...................................... 365/200; 365/201;
365/225.7
[58] Field of Search ................... 365/201, 200, 225.7,
365/96; 371/10.1, 10.3

[56] References Cited

U.S. PATENT DOCUMENTS

| | | | |
|---|---|---|---|
| 4,714,839 | 12/1987 | Chung | 365/96 |
| 4,860,260 | 8/1989 | Saito et al. | 365/201 |
| 5,140,554 | 8/1992 | Schreck et al. | 365/201 |
| 5,276,360 | 1/1994 | Fujima | 365/200 |

*Primary Examiner*—Eugene R. LaRoche
*Attorney, Agent, or Firm*—Sughrue, Mion, Zinn, Macpeak & Seas

[57] ABSTRACT

In a semiconductor memory device including memory cells and redundancy memory cells, a redundancy decoder for accessing the redundancy memory cells and disabling a normal decoder for accessing the memory cells includes a test circuit for introducing a test signal into the redundancy decoder. When the test signal is active, the redundancy decoder is disabled in spite of receiving a redundancy address, and instead, the normal decoder is operated to thereby access the memory cells.

6 Claims, 7 Drawing Sheets

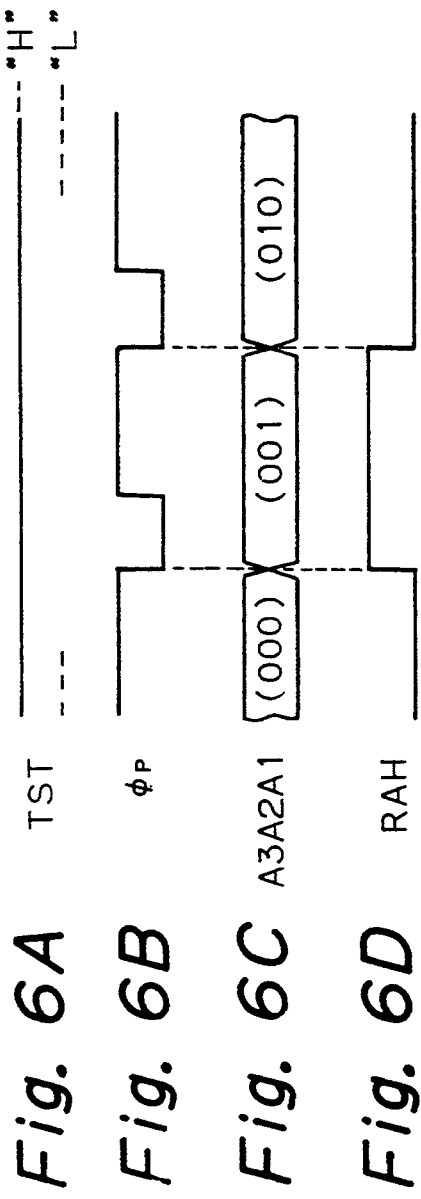
Fig. 6A TST
Fig. 6B φP
Fig. 6C A3A2A1
Fig. 6D RAH
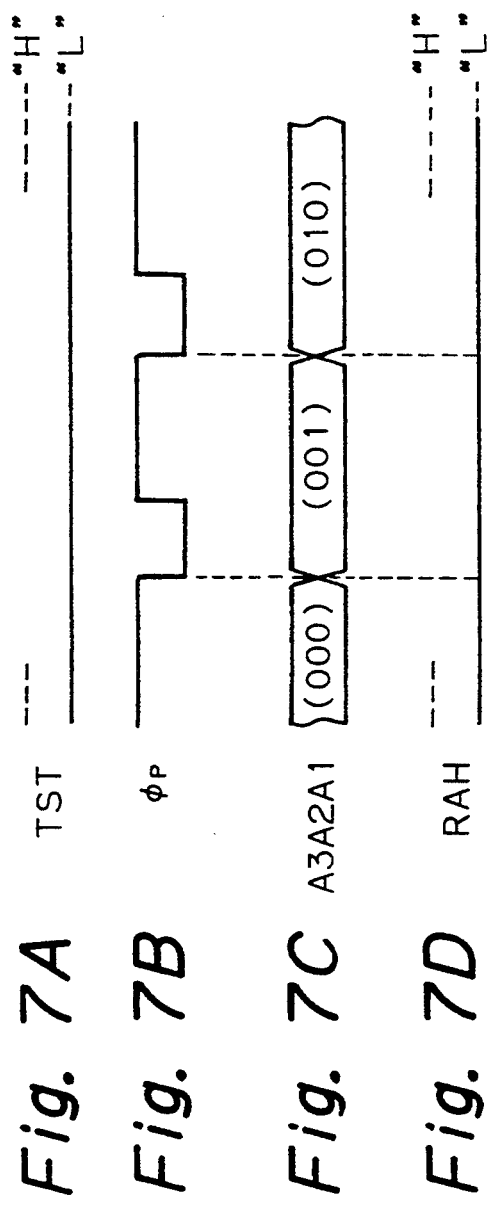
Fig. 7A TST
Fig. 7B φP
Fig. 7C A3A2A1
Fig. 7D RAH

SEMICONDUCTOR MEMORY DEVICE INCORPORATING REDUNDANCY MEMORY CELLS CAPABLE OF ACCESSING DEFECTIVE MEMORY CELLS

BACKGROUND OF THE INVENTION

1. Field of the Invention

The present invention relates to a semiconductor memory device incorporating redundancy memory cells.

2. Description of the Related Art

In a semiconductor memory device incorporating redundancy memory cells, in spite of the presence of one or more defective memory cells, the device can be stored by replacing such defective memory cells with their corresponding redundancy memory cells. In this case, addresses (hereinafter, referred to as redundancy addresses) for indicating the defective memory cells are written into a redundancy decoder. Therefore, when an address indicated by address signals coincides with one of the defective addresses, the redundancy decoder accesses the redundancy memory cells, and a normal decoder for accessing the memory cells is disabled. This will be later explained in detail.

In the above-mentioned semiconductor memory device, however, once a redundancy address indicating a defective memory cell is written into the redundancy decoder, it is impossible to access the defective memory cell due to the disabled normal decoder. Therefore, it is impossible to analyze the defective memory cell and confirm whether or not the replacement of the defective memory cell with its redundancy memory cell is correct.

SUMMARY OF THE INVENTION

It is, therefore, an object of the present invention to enable access to a defective memory cell, even after a redundancy address for indicating the defective memory cell is written into a redundancy decoder in a semiconductor memory device incorporating redundancy memory cells.

According to the present invention, in a semiconductor memory device including memory cells and redundancy memory cells, a redundancy decoder for accessing the redundancy memory cells and disabling a normal decoder for accessing the memory cells includes a test circuit for introducing a test signal into the redundancy decoder. When the test signal is active, the redundancy decoder is disabled in spite of receiving a redundancy address, and instead, the normal decoder is operated to thereby access the memory cells. Thus, even after such a redundancy address indicating a defective memory is written into the redundancy decoder, the defective memory cell can be accessed by activating the test signal to thereby disable the redundancy decoder.

BRIEF DESCRIPTION OF THE DRAWINGS

The present invention will be more clearly understood from the description as set forth below, in comparison with the prior art, with reference to the accompanying drawings, wherein:

FIGS. 6A, 6B, 6C and 6D are timing diagrams showing the operation of the redundancy decoder of FIG. 4;

FIGS. 7A, 7B, 7C and 7D are timing diagrams showing the operation of the redundancy decoder of FIG. 4.

DESCRIPTION OF THE PREFERRED EMBODIMENTS

Before the description of an embodiment of the present invention, a prior art semiconductor memory device will now be explained with reference to FIGS. 1, 2 and 3.

Figure 1:
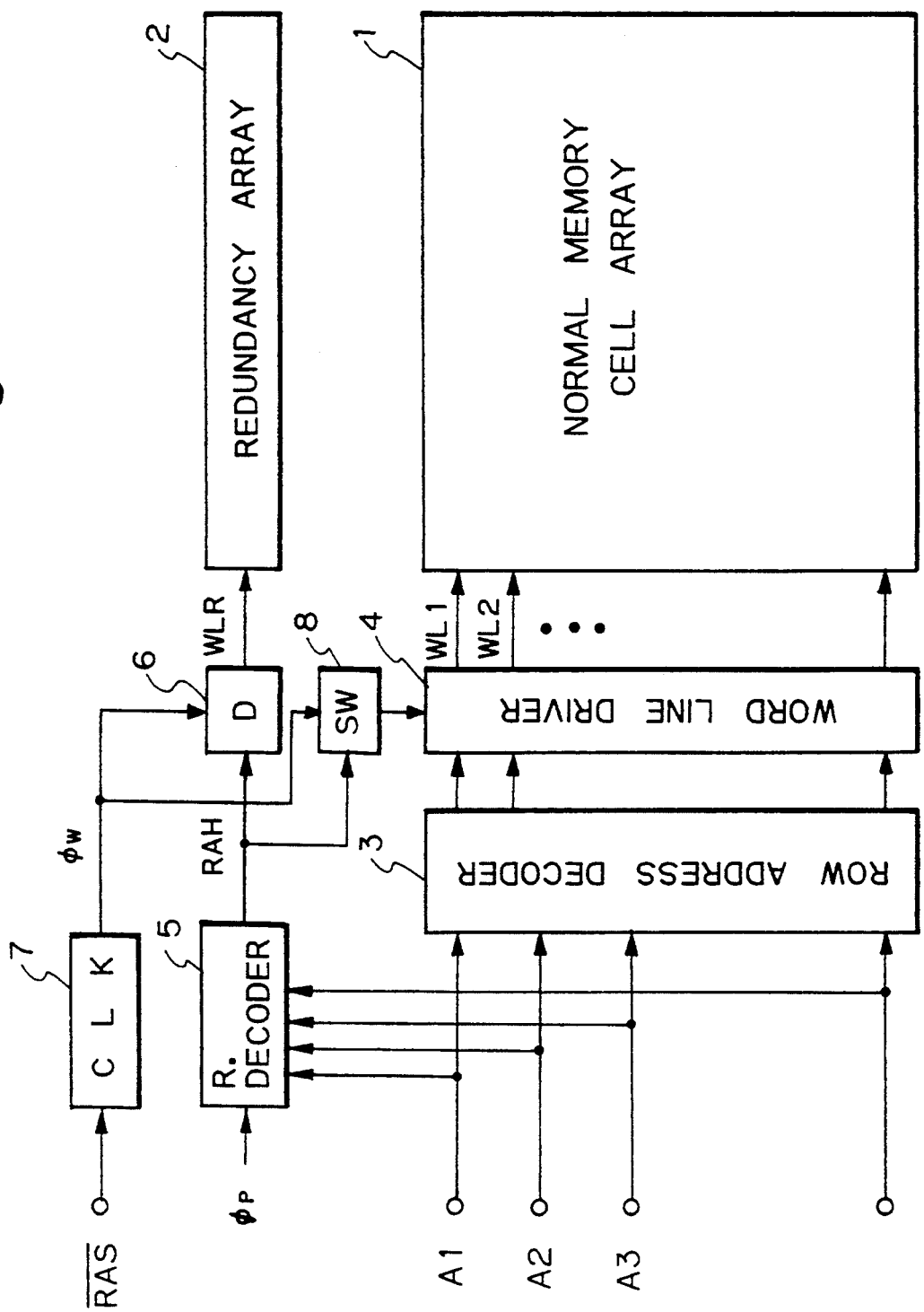
FIG. 1 is a block circuit diagram illustrating a prior art semiconductor memory device.

In FIG. 1, which illustrates a prior art semiconductor memory device, reference numeral 1 designates a normal memory cell array formed by a plurality of memory cells located at intersections between word lines WL1, WL2, ... and the bit lines (not shown), and 2 designates a redundancy memory cell array formed by a row of redundancy memory cells at intersections between a redundancy word line WLR and the bit lines (not shown). Note that two or more rows of redundancy memory cells can be provided, and also, one or more columns of redundancy memory cells can be provided; however, in order to simplify the description, only one row of redundancy memory cells are provided in this example.

One row of the normal memory cell array 1 is accessed by a row address decoder 3 which receives row address signals A1, A2, A3, ..., and a word line driver 4 which activates one of the word lines WL1, WL2, ...

The redundancy memory cell array 2 is accessed by a redundancy decoder 5 which receives the row address signals A1, A2, A3, ... and a redundancy word line driver 6 which activates the redundancy word line WLR. That is, if a defective memory cell is found in the normal memory cell array 1, a redundancy address ADDR indicating a row including the defective memory cell is written into the redundancy decoder 5 which is formed by a fuse-type read-only memory (ROM). In this state, when an address ADD represented by the address signals A1, A2, A3, ... coincides with the redundancy address ADDR, the redundancy decoder 5 generates a redundancy address hit signal RAH and transmits it to the redundancy word line drive 6, to thereby access the redundancy word line WLR.

Also, supplied to the word line driver 4 and the redundancy word line driver 6 is a word line driving clock signal $\phi_W$ which is generated from a clock generator 7 which receives an inverted signal $\overline{RAS}$ of a row address strobe signal RAS. In this case, the word line driving signal $\phi_W$ is supplied to the word line driver 4 via a switch 8 which is controlled by the redundancy address hit signal RAH. That is, when the redundancy address hit signal RAH is inactive (i.e., low), the redundancy word line driver 6 is deactivated so as not to supply the word line driving signal $\phi_W$ to the redundancy word line WLR, and instead of this, the switch 8 is turned ON to pass the word line driving signal $\phi_W$ therethrough to the word line driver 4. Conversely, when the redundancy address hit signal RAH is active, i.e., high, the redundancy word line driver 6 is activated to supply the word line driving signal $\phi_W$ to the redundancy word line WLR, and the switch 8 is turned OFF not so as to pass the word line driving signal $\phi_W$ therethrough.

The redundancy decoder 5 of FIG. 1 is explained in detail with reference to FIG. 2. In FIG. 2, a precharging P-channel MOS (broadly, MIS) transistor Q1 is connected between a power supply voltage terminal $V_{CC}$ and a node N1. The precharging transistor Q1 is turned ON by a precharging signal $\phi_P$ to precharge the node N1 with the potential at the power supply voltage terminal $V_{CC}$.

Also, a plurality of fuses F11, F12, F21, F22, F31, F32, ... and a plurality of switching N-channel NOS transistors Q11, Q12, Q21, Q22, Q31, Q32, ... are connected between the node N1 and a ground terminal GND. In this case, the switching transistors Q11, Q21, Q31, ... are controlled by the address signals A1, A2, A3, ..., and the switching transistors Q12, Q22, Q32, ... are controlled by the outputs of inverters IV1, IV2, IV3, ..., i.e., the inverted signals A1, A2, A3, ... of the address signals $\overline{A1}$, $\overline{A2}$, $\overline{A3}$, ....

When no defective memory cell is found in the normal memory cell array 1, any of the fuses F11, F12, F21, F22, F31, F32, ... are not melted. Therefore, in this case, when any of the row addresses ADD is supplied to the redundancy decoder 5, a current always flows from the node N1 through one of the non-melted fuses F11 and F12, one of the non-melted fuses F21 and F22, one of the non-melted fuses F31 and F32, ..., to the ground terminal GND. As a result, the node N1 is grounded, so that the redundancy address signal RAH is low, i.e., inactive. Thus, the redundancy memory cell array 2 is never accessed.

Contrary to the above, when a defective memory cell is found in the normal memory cell array 1, a redundancy address ADDR indicating a row including this defective memory cell is written in the redundancy decoder 2. For example, if the redundancy address ADDR (A1, A2, A3, ...) is (1, 0, 0, ...), the fuse F11 corresponding to the address signal A1, the fuse F22 corresponding to the inverted address signal $\overline{A2}$, the fuse F32 corresponding to the inverted address signal $\overline{A3}$ are melted by a laser trimming process.

Note that references IV4 and IV5 are inverters for shaping the waveform of the potential at the mode N1.

The operation of the redundancy decoder 5 of FIG. 2 after the redundancy address ADDR is written thereinto is explained with reference to FIGS. 3A, 3B and 3C. Note that only three bits A1, A2 and A3 of the address signals are shown in FIG. 3B, to simplify the description.

As shown in FIG. 3A, the precharging signal $\phi_P$ is low, i.e., active, every time the address ADD (A3A2A1) is changed as shown in FIG. 3B. As a result, the precharging transistor Q1 is turned ON to precharge the node N1 to the level $V_{CC}$. In this case, when the address ADD (A3A2A1) does not coincide with the redundancy address ADDR (A3A2A1=001), a current flows from the node N1 through at least one non-melted fuse and at least one of the turned-ON switching transistors to the ground terminal GND. For example, if the address ADD (A3A2A1) is (000), the switching transistors Q12, Q22 and Q32 are turned ON and the fuses F12 and F22 are not melted. Therefore, the node N1 is grounded, so that the redundancy address hit signal RAH is low, i.e., inactive. Contrary to this, when the address ADD (A3A2A1) coincides with the redundancy address ADDR (A3A2A1=001), the switching transistors Q11, Q22 and Q32 are turned ON while the fuses F11, F22 and F32 connected thereto are melted, so that the node N1 remains at the level $V_{CC}$, to thereby activate the redundancy address signal RAH. Thus, a row including the defective memory cell is replaced with the redundancy memory cell array 2.

Figure 2:
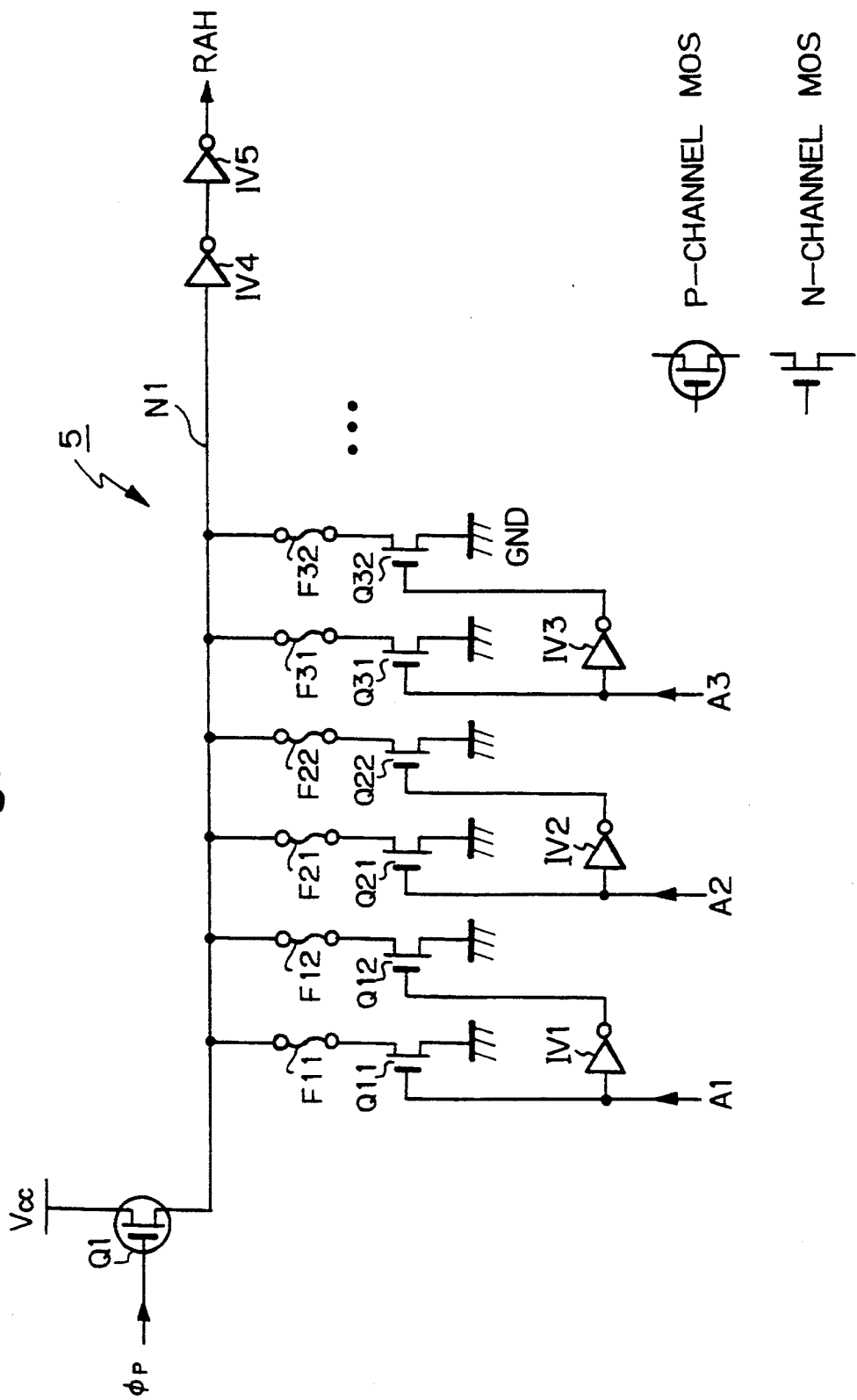
FIG. 2 is a detailed circuit diagram of the redundancy decoder of FIG. 1.
Figure 3:
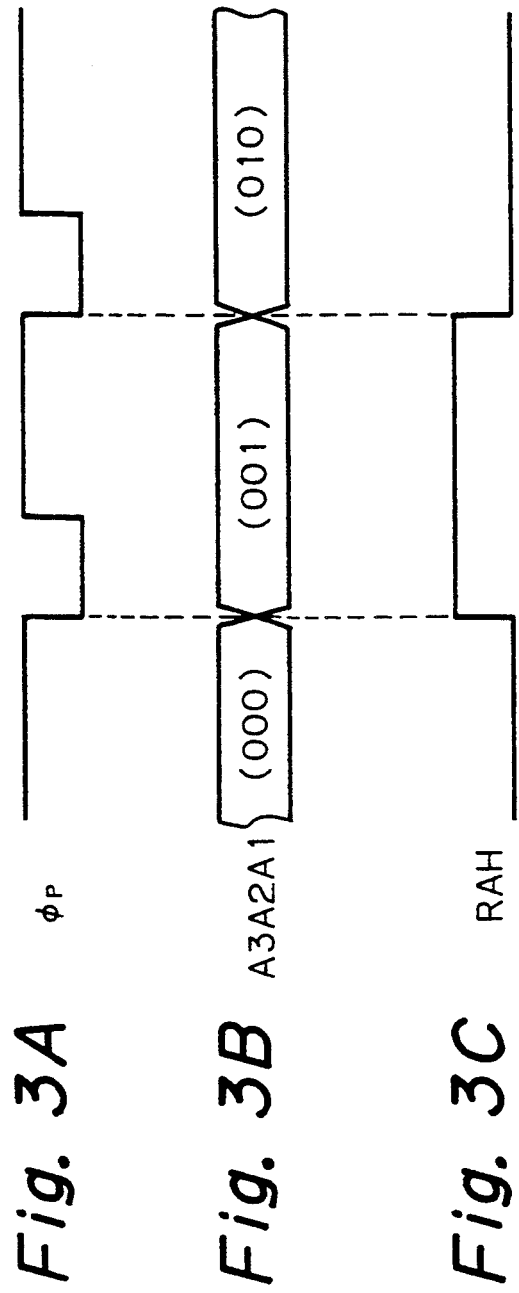
FIGS. 3A, 3B and 3C are timing diagrams showing the operation of the redundancy decoder of FIG. 2.

As explained above, in the semiconductor memory device of FIG. 1 using the redundancy decoder of FIG. 2, however, after a redundancy address ADDR is written into the redundancy decoder 5 by melting some of the fuses, it is impossible to access a defective memory cell having the redundancy address ADDR in the normal memory cell array 1.

Figure 4:
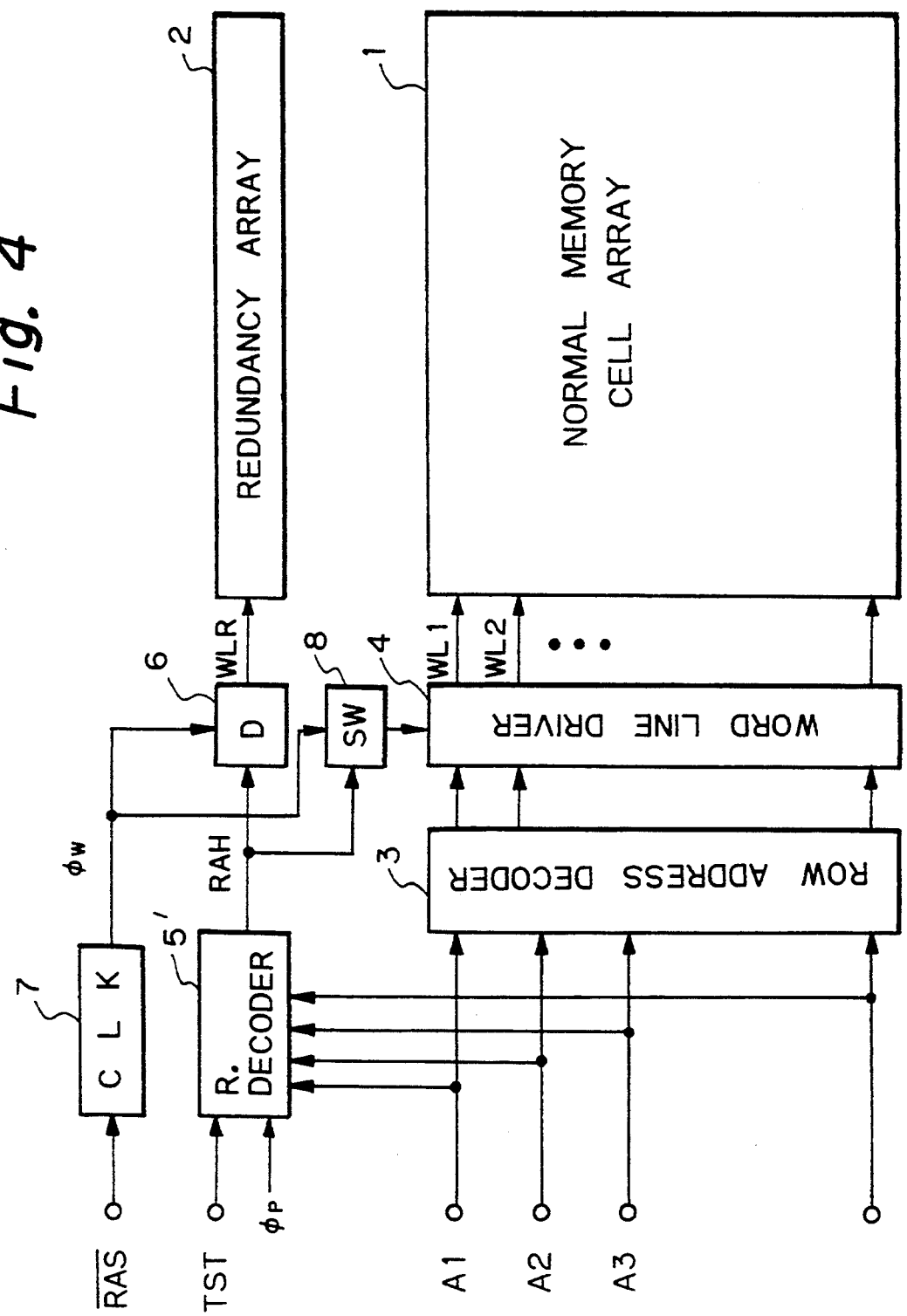
FIG. 4 is a block circuit diagram illustrating an embodiment of the semiconductor memory device according to the present invention.

In FIG. 4, which illustrates an embodiment of the present invention, the redundancy decoder 5 of FIG. 1 is modified to a redundancy decoder 5' which receives a test signal TST. As a result, when the test signal TST is active (i.e., low), the redundancy decoder 5' is always disabled even after a redundancy address ADDR is written thereinto. Therefore, the redundancy address hit signal RAH is always inactive, and it is possible to access the normal memory cell array 1 by using the redundancy address ADDR.

Figure 5:
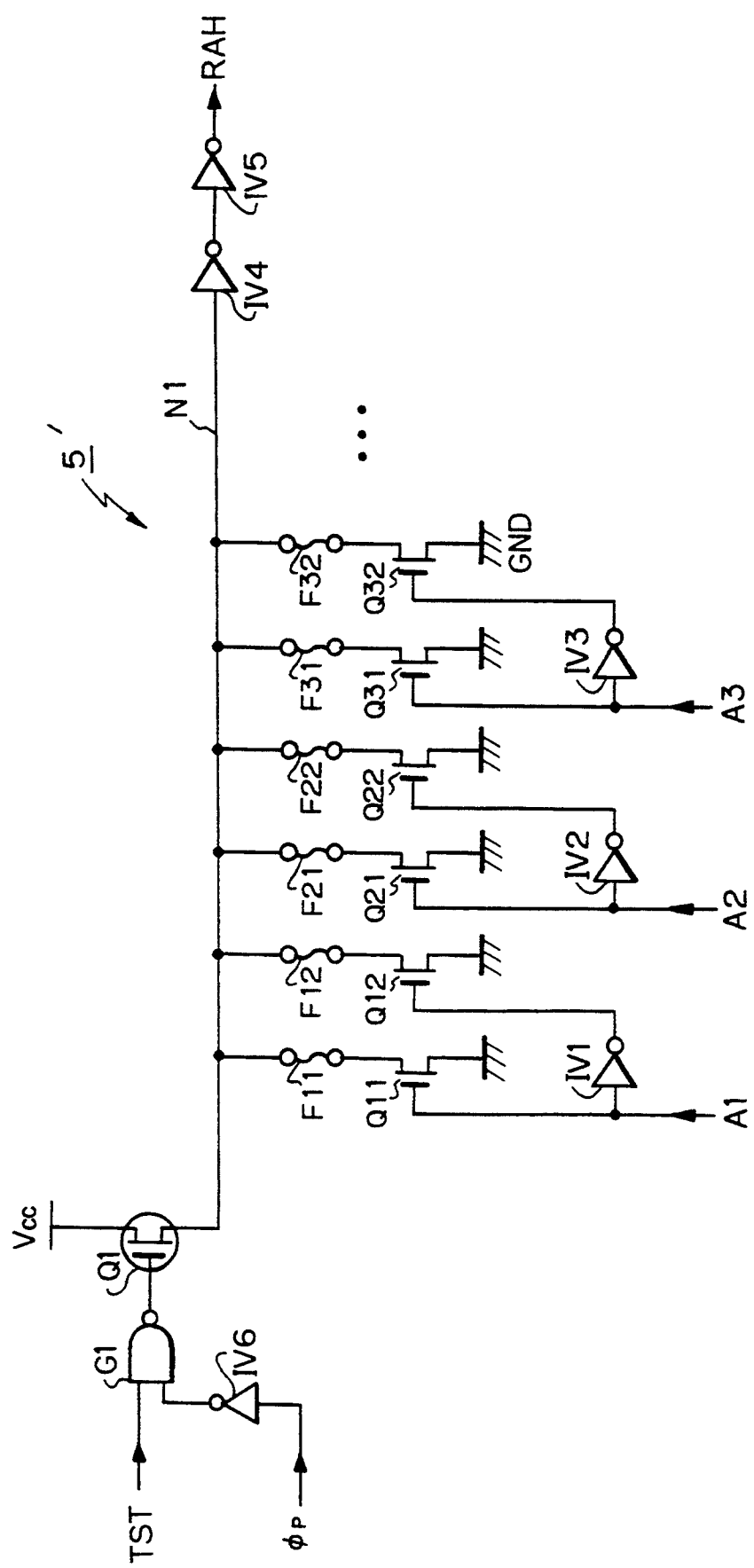
FIG. 5 is a detailed circuit diagram of the redundancy decoder of FIG. 4.

One example of the redundancy decoder 5' of FIG. 4 is explained with reference to FIG. 5. In FIG. 5, an inverter IV6 and a NAND circuit G1 as a test circuit are added to the elements of FIG. 2. When the test signal TST is inactive, i.e., high, the precharging signal $\phi_P$ passes through the NAND circuit G1 to the gate of the precharging transistor Q1, thus precharging the node N1 to the level $V_{CC}$. Conversely, when the test signal TST is active, i.e., low, the precharging signal $\phi_P$ cannot pass through the NAND circuit G1, so that the node N1 remains at the level GND.

The operation of the redundancy decoder 5' of FIG. 5 will now be explained with reference to FIGS. 6A, 6B, 6C and 6D, and FIGS. 7A, 7B, 7C and 7D.

Referring to FIGS. 6A, 6B, 6C and 6D, when the test signal TST is inactive (high) as shown in FIG. 6A, the precharging signal $\phi_P$ as shown in FIG. 6B passes through the NAND circuit G1 to the gate of the precharging transistor Q1. Therefore, the precharging signal $\phi_P$, the address ADD(A3A2A1) and the redundancy address signal RAH as shown in FIGS. 6B, 6C and 6D are the same as those as shown in FIGS. 3A, 3B and 3C, respectively.

Referring to FIGS. 7A, 7B, 7C and 7D, when the test signal TST is active (low) as shown in FIG. 7A, the output of the NAND circuit G1 remains at the level $V_{CC}$ regardless of the precharging signal $\phi_P$ being changed as shown in FIG. 7B. Therefore, the precharging transistor Q1 is always turned OFF, so that the node N1 is not precharged and remains at the level GND. Therefore, the redundancy address hit signal RAH is inactive (low). Thus, in this case, even after a redundancy address ADDR is written into the fuses, the replacement by the redundancy memory cell array 2 is not carried out by using the redundancy address ADDR, and the normal memory cell array 1 is accessed.

Figure 8:
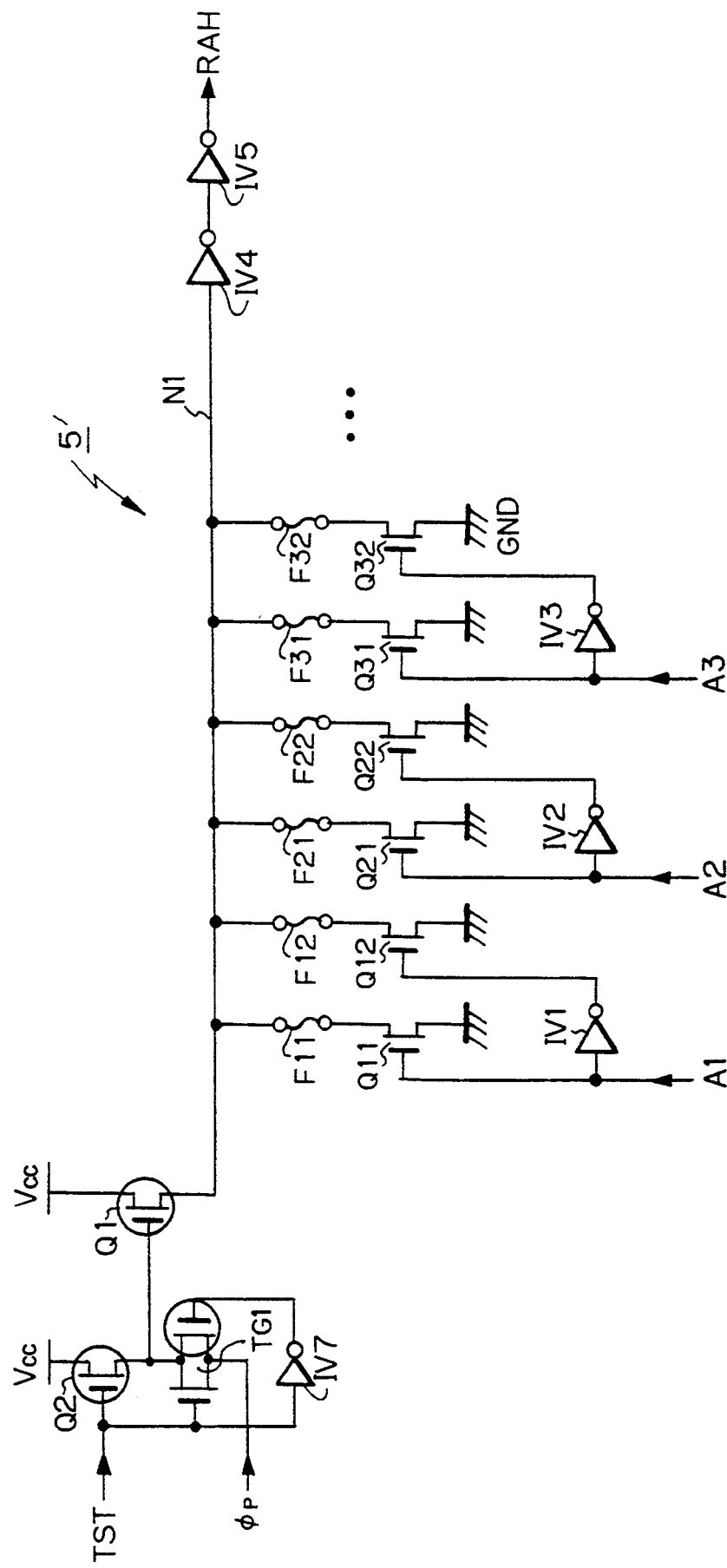
FIG. 8 is another detailed circuit diagram of the redundancy decoder of FIG. 4.

In FIG. 8, which illustrates another example of the redundancy decoder 5' of FIG. 4, a P-channel MOS transistor Q2, a transfer gate TG1 formed by a P-channel MOS transistor and an N-channel MOS transistor, and an inverter IV7 as a test circuit are provided instead of the NAND circuit G1 and the inverter IV6 of FIG. 5. When the test signal TST is inactive (high), the transistor Q2 is turned OFF, and the transfer gate TG1 is turned ON so as to pass the precharging signal $\phi_P$ therethrough to the gate of the precharging transistor Q1, thus precharging the node N1 to the level $V_{CC}$. Conversely, when the test signal TST is active (low), the transistor Q2 is turned ON, and the transfer gate TG1 is turned OFF so as not to pass the precharging signal $\phi_P$. As a result, the potential at the gate of the precharging transistor Q1 is high ($V_{CC}$) so as to turn OFF the precharging transistor Q1, to thereby keep the node N1 at the level GND.

Thus, the operation of the redundancy decoder 5' of FIG. 8 is the same as that of FIG. 5 as shown in FIGS. 6A, 6B, 6C and 6D, and FIGS. 7A, 7B, 7C and 7D.

As explained hereinbefore, according to the present invention, even after a redundancy address indicating a defective memory cell is written into the redundancy decoder, the normal memory cell array can be accessed by using such a redundancy address, thus analyzing the defective memory cell and confirming whether or not the replacement of the defective memory cell to its corresponding redundancy memory cell is correct.

I claim:

1. A semiconductor memory device comprising:
   a plurality of memory cells;
   a plurality of redundancy memory cells;
   a normal decoder means, connected to said memory cells, for accessing said memory cells by a first address; and
   a redundancy decoder means, connected to said redundancy memory cells, for accessing said redundancy memory cells by a second address and disabling said normal decoder means, to thereby replace at least one of said memory cells with their corresponding redundancy memory cells,
   said redundancy decoder means receiving a test signal and being always disabled when said test signal is at a test mode level.

2. A device as set forth in claim 1, wherein said redundancy decoder means comprises:
   a first power supply terminal;
   a second power supply terminal;
   a node for generating a redundancy address hit signal for accessing said redundancy memory cells and disabling said normal decoder means;
   a precharging circuit, connected between said first power supply terminal and said node, for precharging said node with the potential at said first power supply terminal;
   a fuse-type read-only memory, connected between said node and said second power supply terminal, for storing said second address; and
   a test circuit, connected to said precharging circuit, for enabling said precharging circuit in accordance with a precharging signal when said test signal is at a non-test mode level and disabling said precharging circuit when said test signal is active.

3. A device as set forth in claim 2, wherein said test circuit comprises:
   an inverter for receiving said precharging signal; and
   a NAND circuit, connected to said inverter, for receiving an output signal of said inverter and said test signal to generate a signal for enabling said precharging circuit.

4. A device as set forth in claim 2, wherein said test circuit comprises:
   a switching transistor connected between said first power supply terminal and said precharging circuit, said switching transistor being turned ON and OFF in accordance with said test signal; and
   a transfer gate connected to said precharging circuit and controlled by said test signal, said transfer gate being turned ON to pass said precharging signal to said precharging circuit and being turned OFF so as not to pass said precharging signal.

5. A device as set forth in claim 2, wherein said fuse-type read-only memory comprises:
   a plurality of fuses connected to said node, said fuses being melted in accordance with said second address; and
   a plurality of switches, each connected to one of said fuses and to said second power supply terminal, said switches being turned ON and OFF by address signals.

6. A semiconductor memory device comprising:
   a plurality of memory cells;
   a plurality of redundancy memory cells;
   a normal decoder means, connected to said memory cells, for accessing said memory cells by a first address; and
   a redundancy decoder means, connected to said redundancy memory cells, for accessing said redundancy memory cells by a second address and disabling said normal decoder means, to thereby replace at least one of said memory cells with their corresponding redundancy memory cells;
   said redundancy decoder means receiving a test signal and being always disabled when said test signal is at a test mode level;
   wherein said redundancy decoder means comprises a first power supply terminal, a second power supply terminal, a node for generating a redundancy address hit signal for accessing said redundancy memory cells and disabling said normal decoder means, a precharging circuit, connected between said first power supply terminal and said node, for precharging said node with the potential at said first power supply terminal, a fuse-type read-only memory, connected between said node and said second power supply terminal, for storing said second address, and a test circuit, connected to said precharging circuit, for enabling said precharging circuit in accordance with a precharging signal when said test signal is at a non-test mode level and disabling said precharging circuit when said test signal is active;
   wherein said test circuit comprises, a switching transistor connected between said first power supply terminal and said precharging circuit, said switching transistor being turned ON and OFF in accordance with said test signal, and a transfer gate connected to said precharging circuit and controlled by said test signal, said transfer gate being turned ON to pass said precharging signal to said precharging circuit and being turned OFF so as not to pass said precharging signal.

* * * * *

UNITED STATES PATENT AND TRADEMARK OFFICE
CERTIFICATE OF CORRECTION

PATENT NO. : 5,381,371
DATED : Jan. 10, 1995
INVENTOR(S) : Yoshinori Haraguchi

It is certified that error appears in the above-indentified patent and that said Letters Patent is hereby corrected as shown below:

Col. 3, line 24   delete "A1, A2, A3" and insert --$\overline{A1}, \overline{A2}, \overline{A3}$--.

Col. 3, line 25   delete "$\overline{A1}, \overline{A2}, \overline{A3}$" and insert --A1, A2, A3--.

Signed and Sealed this

Nineteenth Day of September, 1995

Attest:

BRUCE LEHMAN

Attesting Officer          Commissioner of Patents and Trademarks